United States Patent
Kusaka

(10) Patent No.: US 8,912,645 B2
(45) Date of Patent: Dec. 16, 2014

(54) SEMICONDUCTOR ELEMENT COOLING STRUCTURE

(75) Inventor: Hiroto Kusaka, Toyota (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 14/125,852

(22) PCT Filed: Jun. 15, 2011

(86) PCT No.: PCT/JP2011/063664
§ 371 (c)(1),
(2), (4) Date: Dec. 12, 2013

(87) PCT Pub. No.: WO2012/172650
PCT Pub. Date: Dec. 20, 2012

(65) Prior Publication Data
US 2014/0110834 A1    Apr. 24, 2014

(51) Int. Cl.
*H01L 23/34* (2006.01)
*H01L 23/467* (2006.01)
*H05K 7/20* (2006.01)

(52) U.S. Cl.
CPC .......... *H01L 23/467* (2013.01); *H05K 7/20918* (2013.01); *H01L 2924/0002* (2013.01)
USPC .......................................... 257/714; 257/722

(58) Field of Classification Search
USPC ........................... 257/714, 706, 707, 722, 713
See application file for complete search history.

(56) References Cited

U.S. PATENT DOCUMENTS

| | | | | |
|---|---|---|---|---|
| 6,557,354 | B1 * | 5/2003 | Chu et al. | 62/3.2 |
| 7,134,484 | B2 * | 11/2006 | Mok et al. | 165/80.4 |
| 7,548,425 | B2 * | 6/2009 | Hata et al. | 361/699 |
| 8,387,685 | B2 * | 3/2013 | Kimbara et al. | 165/80.4 |
| 2004/0141290 | A1 | 7/2004 | Aoki et al. | |
| 2006/0225867 | A1 | 10/2006 | Park et al. | |
| 2008/0106866 | A1 | 5/2008 | Hori et al. | |
| 2012/0125164 | A1 * | 5/2012 | Kozak | 81/177.6 |
| 2014/0091452 | A1 * | 4/2014 | Katou et al. | 257/706 |
| 2014/0124182 | A1 * | 5/2014 | Kwak et al. | 165/168 |
| 2014/0125164 | A1 * | 5/2014 | Mukunoki et al. | 310/54 |

FOREIGN PATENT DOCUMENTS

| | | | |
|---|---|---|---|
| JP | 2000-151166 | A | 5/2000 |
| JP | 2003-33002 | A | 1/2003 |
| JP | 2004-221471 | A | 8/2004 |
| JP | 2006-295178 | A | 10/2006 |
| JP | 2006-351858 | A | 12/2006 |
| JP | 2008-118077 | A | 5/2008 |
| JP | 2009-10212 | A | 1/2009 |

* cited by examiner

*Primary Examiner* — S. V. Clark
(74) *Attorney, Agent, or Firm* — Sughrue Mion, PLLC

(57) ABSTRACT

A semiconductor element cooling structure includes a side wall provided on a downstream side of flow of cooling air in a cooling air passage, a plurality of cooling fins forming cooling air branch passages, and a plurality of cooling fins forming cooling air branch passages. The cooling fins each have an end portion at a tip extending toward the cooling air passage. A virtual line obtained by connecting the end portions of the plurality of cooling fins and a virtual line obtained by connecting the end portions of the plurality of cooling fins each have a gradient with respect to a direction of the flow of the cooling air in the cooling air passage which is greater on an upstream side of the flow of the cooling air in the cooling air passage than on the downstream side thereof.

6 Claims, 6 Drawing Sheets

SEMICONDUCTOR ELEMENT COOLING STRUCTURE

CROSS REFERENCE TO RELATED APPLICATIONS

This application is a National Stage of International Application No. PCT/JP2011/063664 filed Jun. 15, 2011, the contents of all of which are incorporated herein by reference in their entirety.

TECHNICAL FIELD

The present invention relates generally to a semiconductor element cooling structure, and more particularly to a semiconductor element cooling structure applied to a power control unit (PCU) mounted in a vehicle.

BACKGROUND ART

Regarding conventional semiconductor element cooling structures, for example, Japanese Patent Laying-Open No. 2006-295178 discloses a heat sink device for an electronic element directed to maintaining a uniform flow rate of a heat absorbing fluid such that a surface in contact with the electronic element has a constant temperature (Patent Document 1).

The heat sink device disclosed in Patent Document 1 has a plurality of flow passages partitioned at predetermined intervals by a plurality of flow passage walls, and an inflow guide portion guiding the heat absorbing fluid flowing in through an inflow port to each of the plurality of flow passages. The inflow guide portion is provided with an inflow guide plate which is linearly inclined such that its flow passage cross sectional area decreases with distance from the inflow port. Further, in another heat sink device, one ends of the plurality of flow passage walls are formed to extend longer toward the inflow guide portion with distance from the inflow port such that the flow passage cross sectional area of the inflow guide portion decreases with distance from the inflow port.

In addition, Japanese Patent Laying-Open No. 2003-33002 discloses a power conversion device directed to being able to prevent thermal interference of another heat sink and increasing the number of semiconductor elements without increasing the area of a portion facing a cooling gas (Patent Document 2). In the power conversion device disclosed in Patent Document 2, a plurality of radiating fins are attached to a heat receiving plate to constitute a heat sink. The radiating fins of the heat sink on a side close to an inlet for the cooling gas are formed in a stair-like manner such that they protrude more with distance from the inlet.

CITATION LIST

Patent Document

PTD 1: Japanese Patent Laying-Open No. 2006-295178
PTD 2: Japanese Patent Laying-Open No. 2003-33002

SUMMARY OF INVENTION

Technical Problem

As disclosed in the above patent documents, various cooling structures are adopted in semiconductor elements (power semiconductor elements) used in an inverter circuit and the like, because operation of the semiconductor elements involves very large heat generation.

In a case where a plurality of semiconductor elements are cooled at once using these cooling structures, there is a concern that, if the flow rate of a cooling medium supplied to each semiconductor element varies, the plurality of semiconductor elements are not cooled uniformly. When temperatures of the semiconductor elements vary, it is required to set the performance of a fan for supplying the cooling medium and a starting temperature at which a load factor of the semiconductor elements is limited based on a semiconductor element having a low cooling efficiency, causing an increase in the size of a cooling structure, a deterioration in the performance exhibited by the semiconductor elements, and the like.

Accordingly, one object of the present invention is to solve the aforementioned problem, and to provide a semiconductor element cooling structure uniformly cooling a plurality of semiconductor elements.

Solution to Problem

A semiconductor element cooling structure in accordance with the present invention is a cooling structure having a cooling medium passage through which a cooling medium flows and first branch passages and second branch passages branched from the cooling medium passage and arranged on both sides of the cooling medium passage formed therein, for cooling a plurality of semiconductor elements by the cooling medium flowing through the first branch passages and the second branch passages. The semiconductor element cooling structure includes a wall portion provided on a downstream side of flow of the cooling medium in the cooling medium passage, a plurality of first fin portions arranged to be spaced from one another in a direction of the flow of the cooling medium in the cooling medium passage to form the first branch passages at positions adjacent to one another, and a plurality of second fin portions arranged to be spaced from one another in the direction of the flow of the cooling medium in the cooling medium passage to form the second branch passages at positions adjacent to one another. The first fin portions and the second fin portions each have an end portion at a tip extending toward the cooling medium passage.

The plurality of the first fin portions are provided such that the end portion of the first fin portion does not extend more toward the cooling medium passage than the end portion of the first fin portion adjacent thereto on the downstream side of the flow of the cooling medium in the cooling medium passage. The plurality of the second fin portions are provided such that the end portion of the second fin portion does not extend more toward the cooling medium passage than the end portion of the second fin portion adjacent thereto on the downstream side of the flow of the cooling medium in the cooling medium passage. A virtual line obtained by connecting the end portions of the plurality of the first fin portions and a virtual line obtained by connecting the end portions of the plurality of the second fin portions each have a gradient with respect to the direction of the flow of the cooling medium in the cooling medium passage which is greater on an upstream side of the flow of the cooling medium in the cooling medium passage than on the downstream side thereof.

With the semiconductor element cooling structure configured as described above, on the downstream side of the flow of the cooling medium in the cooling medium passage, the cooling medium flowing through the cooling medium passage impinges on the wall portion and flows into the first branch passages and the second branch passages. Accordingly, there is a tendency that the flow rate of the cooling medium in the first branch passages and the second branch passages is higher on the downstream side of the flow of the cooling medium in the cooling medium passage than on the upstream side thereof. Thus, the virtual line obtained by connecting the end portions of the plurality of the first fin portions and the virtual line obtained by connecting the end portions of the plurality of the second fin portions are each formed to have a gradient which is greater on the upstream side of the flow of the cooling medium in the cooling medium passage than on the downstream side thereof, to allow the cooling medium flowing through the cooling medium passage to flow into the first cooling medium passages and the second cooling medium passages easier on the upstream side of the flow of the cooling medium in the cooling medium passage than on the downstream side thereof. Thereby, variations in the flow rate of the cooling medium in the first branch passages and the second branch passages between the upstream side and the downstream side of the flow of the cooling medium in the cooling medium passage can be suppressed, and the plurality of semiconductor elements can be cooled more uniformly.

Preferably, the virtual line obtained by connecting the end portions extends in a direction parallel to the direction of the flow of the cooling medium in the cooling medium passage on the downstream side of the flow of the cooling medium in the cooling medium passage, and extends in a direction oblique to the direction of the flow of the cooling medium in the cooling medium passage on the upstream side of the flow of the cooling medium in the cooling medium passage. Preferably, the virtual line obtained by connecting the end portions is curved with a gradient with respect to the direction of the flow of the cooling medium in the cooling medium passage being increased from the downstream side toward the upstream side of the flow of the cooling medium in the cooling medium passage.

With the semiconductor element cooling structure configured as described above, variations in the flow rate of the cooling medium in the first branch passages and the second branch passages between the upstream side and the downstream side of the flow of the cooling medium in the cooling medium passage can be suppressed more effectively.

Preferably, the semiconductor element cooling structure further includes a case body having the wall portion and accommodating the first fin portions and the second fin portions, and a fan supplying the cooling medium toward the case body. An opening opened on the upstream side of the flow of the cooling medium in the cooling medium passage is formed in the case body. The fan is directly connected to the opening.

With the semiconductor element cooling structure configured as described above, the plurality of semiconductor elements can be cooled uniformly without a rectifying duct interposed between the fan and the case body.

Preferably, the fan is a centrifugal fan, and is connected to the opening such that, in a cross section where the fan is connected to the opening, a flow rate of the cooling medium decreases from a side close to the first fin portions toward a side close to the second fin portions. The virtual line obtained by connecting the end portions of the plurality of the second fin portions has a gradient greater than that of the virtual line obtained by connecting the end portions of the plurality of the first fin portions.

With the semiconductor element cooling structure configured as described above, the virtual line obtained by connecting the end portions of the plurality of the second fin portions is formed to have a gradient greater than that of the virtual line obtained by connecting the end portions of the plurality of the first fin portions, to allow the cooling medium flowing through the cooling medium passage to flow into the second cooling medium passages easier than into the first cooling medium passages. Thereby, variations in the flow rate of the cooling medium in the first branch passages and the second branch passages from each other can be suppressed, irrespective of the characteristics of the centrifugal fan that the flow rate of the cooling medium supplied to the cooling medium passage varies.

Preferably, the semiconductor element cooling structure further includes a protrusion provided on the wall portion and protruding toward the cooling medium passage between the first branch passages and the second branch passages.

With the semiconductor element cooling structure configured as described above, the cooling medium flowing through the cooling medium passage can be caused to flow into the first branch passages and the second branch passages more smoothly.

Advantageous Effects of Invention

As described above, according to the present invention, a semiconductor element cooling structure uniformly cooling a plurality of semiconductor elements can be provided.

DESCRIPTION OF EMBODIMENTS

Figure 1:
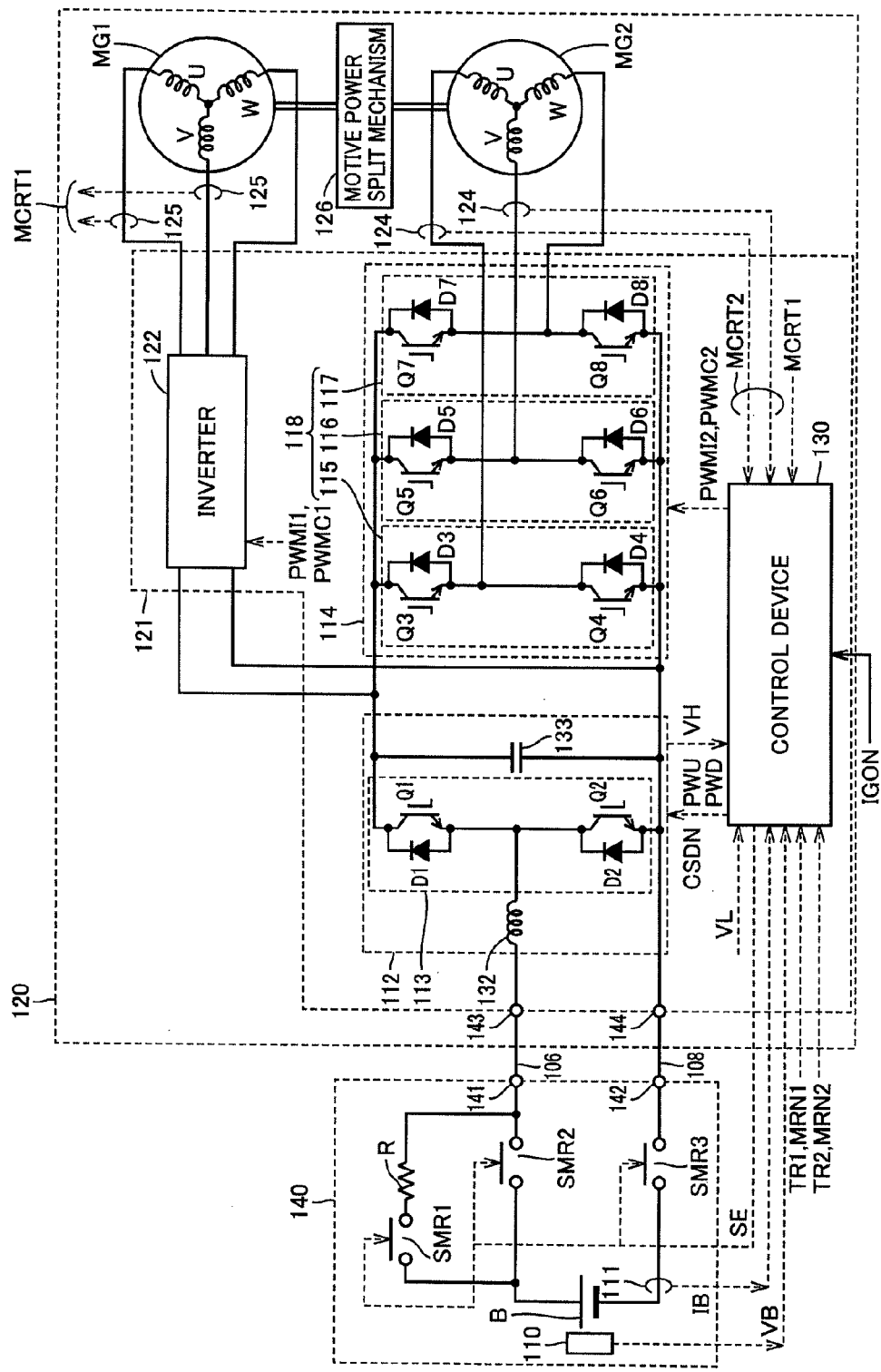
FIG. 1 is a circuit diagram showing a configuration related to control of motor generators in a hybrid vehicle.

Embodiments of the present invention will be described with reference to the drawings. It is noted that, in the drawings referred to below, identical or corresponding members will be designated by the same reference numerals.

Embodiment 1

FIG. 1 is a circuit diagram showing a configuration related to control of motor generators in a hybrid vehicle. In the present embodiment, a semiconductor element cooling structure in accordance with the present invention is applied to a power control unit (PCU) mounted in a hybrid vehicle.

Referring to FIG. 1, firstly, control of motor generators in a hybrid vehicle will be described. The hybrid vehicle uses, as motive power sources, an internal combustion engine such as a gasoline engine or a diesel engine, and a motor powered from a chargeable/dischargeable secondary cell (battery).

The hybrid vehicle has a battery unit 140, a vehicle drive device 120, and an engine not shown. Vehicle drive device 120 has motor generators MG1, MG2, a motive power split mechanism 126 distributing motive power among the engine not shown and motor generators MG1, MG2, and a power control unit 121 controlling motor generators MG1, MG2.

Motor generator MG1 mainly functions as a generator, and generates electric power using an output of the engine. Further, when the engine is started, motor generator MG1 operates as a starter. Motor generator MG2 mainly functions as a motor, and assists the output of the engine to enhance a drive force. Further, during regenerative braking, motor generator MG2 generates electric power and charges a battery B.

Battery unit 140 is provided with terminals 141, 142. PCU 121 is provided with DC terminals 143, 144. Terminal 141 and DC terminal 143 are electrically connected by a cable 106, and terminal 142 and DC terminal 144 are electrically connected by a cable 108.

Battery unit 140 has battery B, a system main relay SMR2 connected between a positive electrode of battery B and terminal 141, a system main relay SMR3 connected between a negative electrode of battery B and terminal 142, and a system main relay SMR1 and a limiting resistor R connected in series between the positive electrode of battery B and terminal 141. Conduction/non-conduction states of system main relays SMR1 to SMR3 are controlled in response to a control signal SE given from a control device 130 described later.

Battery unit 140 has a voltage sensor 110 measuring a voltage VB between the terminals of battery B, and a current sensor 111 detecting a current IB flowing to battery B. As battery B, a secondary battery such as a nickel hydride battery or a lithium ion battery, a fuel cell, or the like can be used. As a power storage device as an alternative to battery B, a large-capacity capacitor such as an electric double-layer capacitor can also be used.

Power control unit 121 has inverters 122, 114 provided corresponding to motor generators MG1, MG2, respectively, a boost converter 112 provided in common for inverters 122, 114, and control device 130.

Boost converter 112 boosts a voltage between DC terminals 143, 144. Boost converter 112 has a reactor 132 having one end connected to terminal 143, a boosting IPM (Intelligent Power Module) 113, and a smoothing capacitor 133. Boosting IPM 113 has IGBT elements Q1, Q2 connected in series between output terminals of boost converter 112 which outputs a boosted voltage VH, and diodes D1, D2 connected in parallel with IGBT elements Q1, Q2, respectively. Smoothing capacitor 133 smoothes the voltage boosted by boost converter 112.

Reactor 132 has the other end connected to an emitter of IGBT element Q1 and a collector of IGBT element Q2. Diode D1 has a cathode connected to a collector of IGBT element Q1, and an anode connected to the emitter of IGBT element Q1. Diode D2 has a cathode connected to the collector of IGBT element Q2, and an anode connected to an emitter of IGBT element Q2.

Inverter 114 converts a DC voltage output by boost converter 112 into a three-phase AC, and outputs it to motor generator MG2 which drives the wheels. Inverter 114 returns electric power generated at motor generator MG2 during regenerative braking to boost converter 112. On this occasion, boost converter 112 is controlled by control device 130 to operate as a buck circuit.

Inverter 114 has a U-phase arm 115, a V-phase arm 116, and a W-phase arm 117 constituting a running IPM 118. U-phase arm 115, V-phase arm 116, and W-phase arm 117 are connected in parallel between output lines of boost converter 112.

U-phase arm 115 has IGBT elements Q3, Q4 connected in series, and diodes D3, D4 connected in parallel with IGBT elements Q3, Q4, respectively. Diode D3 has a cathode connected to a collector of IGBT element Q3, and an anode connected to an emitter of IGBT element Q3. Diode D4 has a cathode connected to a collector of IGBT element Q4, and an anode connected to an emitter of IGBT element Q4.

V-phase arm 116 has IGBT elements Q5, Q6 connected in series, and diodes D5, D6 connected in parallel with IGBT elements Q5, Q6, respectively. Diode D5 has a cathode connected to a collector of IGBT element Q5, and an anode connected to an emitter of IGBT element Q5. Diode D6 has a cathode connected to a collector of IGBT element Q6, and an anode connected to an emitter of IGBT element Q6.

W-phase arm 117 has IGBT elements Q7, Q8 connected in series, and diodes D7, D8 connected in parallel with IGBT elements Q7, Q8, respectively. Diode D7 has a cathode connected to a collector of IGBT element Q7, and an anode connected to an emitter of IGBT element Q7. Diode D8 has a cathode connected to a collector of IGBT element Q8, and an anode connected to an emitter of IGBT element Q8.

An intermediate point of each phase arm is connected to each phase end of each phase coil of motor generator MG2. More specifically, motor generator MG2 is a three-phase permanent magnet synchronous motor, and one ends of three coils, i.e., U-, V- and W-phase coils, are connected together to a neutral point. The other end of the U-phase coil is connected to a connection node of IGBT elements Q3, Q4. The other end of the V-phase coil is connected to a connection node of IGBT elements Q5, Q6. The other end of the W-phase coil is connected to a connection node of IGBT elements Q7, Q8.

A current sensor 125 detects a current flowing to motor generator MG1 as a motor current value MCRT1, and outputs motor current value MCRT1 to control device 130. A current sensor 124 detects a current flowing to motor generator MG2 as a motor current value MCRT2, and outputs motor current value MCRT2 to control device 130.

Inverter 122 is connected to boost converter 112 in parallel with inverter 114. Inverter 122 converts the DC voltage output by boost converter 112 into a three-phase AC, and outputs it to motor generator MG1. Upon receiving the boosted voltage from boost converter 112, inverter 122 drives motor generator MG1, for example, to start the engine.

Further, inverter 122 returns the electric power generated at motor generator MG1 by a rotational torque transmitted from a crankshaft of the engine, to boost converter 112. On this occasion, boost converter 112 is controlled by control device 130 to operate as a buck circuit. It is noted that inverter 122 has an internal configuration identical to that of inverter 114, and the detailed description thereof is not repeated.

Control device 130 receives torque command values TR1, TR2, motor rotation numbers MRN1, MRN2, respective values of voltages VB, VL, VH and current IB, motor current values MCRT1, MCRT2, and an activation signal IGON.

Here, torque command value TR1, motor rotation number MRN1, and motor current value MCRT1 relate to motor generator MG1, and torque command value TR2, motor rotation number MRN2, and motor current value MCRT2 relate to motor generator MG2. Voltage VB is the voltage of battery B, and current IB is the current flowing to battery B. Voltage VL is a voltage of boost converter 112 before being boosted, and voltage VH is a voltage of boost converter 112 after being boosted.

Control device 130 outputs, to boost converter 112, a control signal PWU giving a boost instruction, a control signal PWD giving a buck instruction, and a signal CSDN giving an instruction to prohibit operation.

Control device 130 outputs, to inverter 114, a drive instruction PWMI2 to convert the DC voltage which is an output of boost converter 112 into an AC voltage for driving motor generator MG2, and a regeneration instruction PWMC2 to convert an AC voltage generated at motor generator MG2 into a DC voltage and return it to boost converter 112. Control device 130 outputs, to inverter 122, a drive instruction PWMI1 to convert the DC voltage into an AC voltage for driving motor generator MG1, and a regeneration instruction PWMC1 to convert an AC voltage generated at motor generator MG1 into a DC voltage and return it to boost converter 112.

Figure 2:
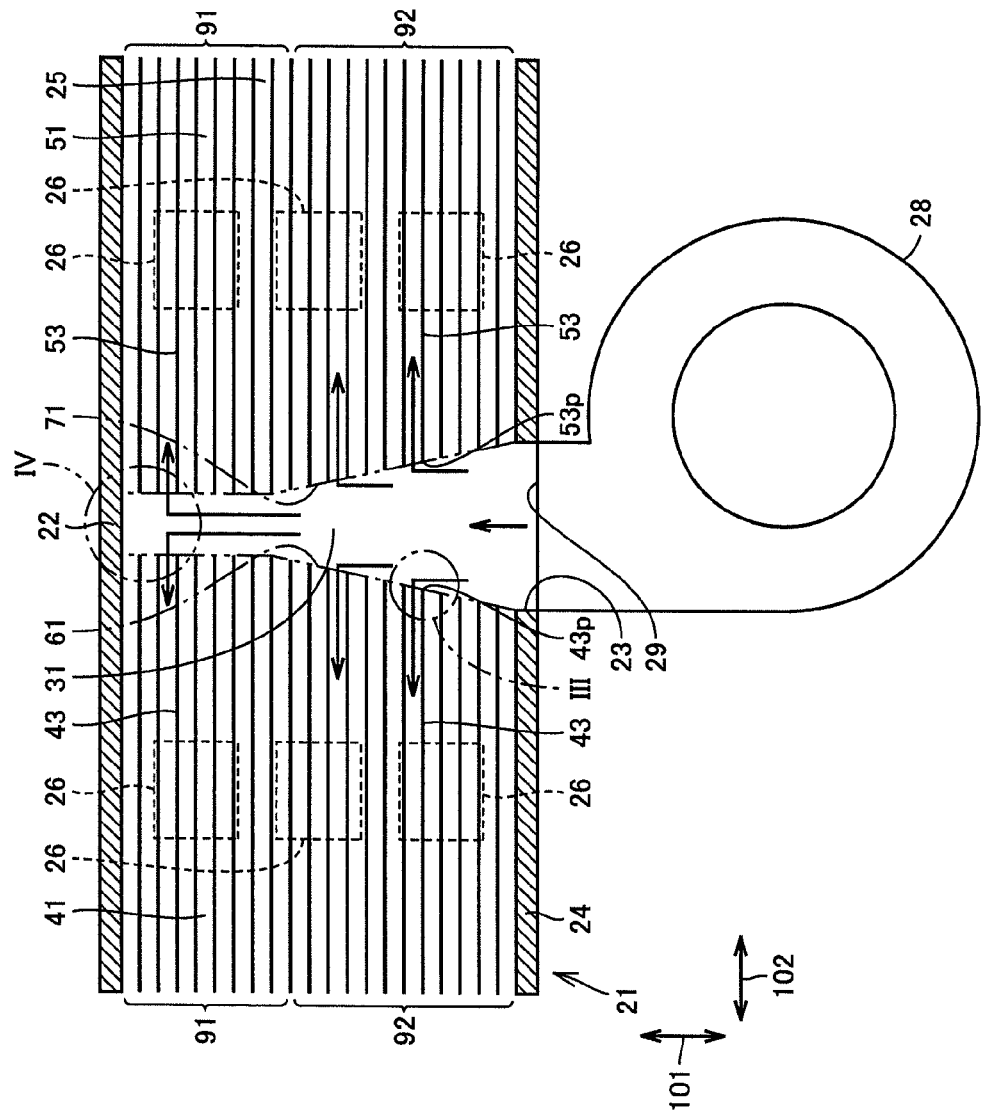
FIG. 2 is a cross sectional view showing a semiconductor element cooling structure in Embodiment 1 of the present invention.

FIG. 2 is a cross sectional view showing a semiconductor element cooling structure in Embodiment 1 of the present invention. Next, a semiconductor element cooling structure applied to the power control unit in FIG. 1 will be described.

Referring to FIG. 2, the semiconductor element cooling structure in the present embodiment has a cooler case 21 as a case body, a plurality of cooling fins 43, a plurality of cooling fins 53, and a centrifugal fan (sirocco fan) 28.

Cooler case 21 has a tubular shape extending in a direction indicated by an arrow 102. Cooler case 21 is formed of a metal, and is formed of aluminum in the present embodiment. Cooler case 21 has a side wall 22, a side wall 24, and a bottom wall 25.

Cooler case 21 has a rectangular cross section when it is cut along a plane perpendicular to the direction in which cooler case 21 having the tubular shape extends. Side wall 22 serves as one side of the rectangular cross section, side wall 24 serves as another side thereof, and bottom wall 25 serves as still another side thereof. Side wall 22 and side wall 24 face each other with a distance therebetween in a direction indicated by an arrow 101 perpendicular to the direction indicated by arrow 102. Bottom wall 25 extends between side wall 22 and side wall 24 in the direction indicated by arrow 101. An opening 23 which allows communication between the inside and the outside of cooler case 21 is formed in side wall 24. Side wall 22 is arranged at a position opposite to opening 23.

A plurality of semiconductor elements 26 are bonded on an outer surface of bottom wall 25. In the present embodiment, six power semiconductor modules constituting running IPM 118 (U-phase arm 115, V-phase arm 116, and W-phase arm 117) are provided as the plurality of semiconductor elements 26.

Centrifugal fan 28 is provided as a fan for supplying air into cooler case 21. Centrifugal fan 28 is a fan blowing the air from the center of rotation of the fan in a radial direction thereof using a centrifugal force. Centrifugal fan 28 has a blowing outlet 29 through which the air is blown out of the fan. Blowing outlet 29 is opened in a direction of a tangent to a direction in which the fan rotates. Centrifugal fan 28 is directly connected to opening 23. Centrifugal fan 28 is connected to cooler case 21 such that blowing outlet 29 and opening 23 are arranged continuously.

It is noted that a cooling medium supplied into cooler case 21 is not limited to a gas, and may be a liquid such as an LLC (Long Life Coolant) or an oil. Further, although the number of semiconductor elements 26 is not particularly limited, the semiconductor element cooling structure in the present embodiment is used more suitably when cooling four or more semiconductor elements 26 at once.

The plurality of cooling fins 43 and the plurality of cooling fins 53 are accommodated in cooler case 21. The plurality of cooling fins 43 and the plurality of cooling fins 53 are arranged at positions with a distance therebetween in the direction indicated by arrow 102.

A cooling air passage 31 is formed between the plurality of cooling fins 43 and the plurality of cooling fins 53. Specifically, the plurality of cooling fins 43 are arranged on one side of cooling air passage 31, and the plurality of cooling fins 53 are arranged on the other side of cooling air passage 31. Cooling air passage 31 extends in one direction indicated by arrow 101. Opening 23 is arranged on an upstream side of flow of cooling air in cooling air passage 31, and side wall 22 is arranged on a downstream side thereof. When centrifugal fan 28 is driven, the cooling air is supplied to cooling air passage 31 through opening 23. The cooling air supplied to cooling air passage 31 flows in the direction indicated by arrow 101.

The plurality of cooling fins 43 are arranged to be spaced from one another in a direction of the flow of the cooling air in cooling air passage 31. The plurality of cooling fins 43 are arranged at equal intervals. The plurality of cooling fins 43 are arranged consecutively between side wall 22 and side wall 24. The plurality of cooling fins 53 are arranged to be spaced from one another in the direction of the flow of the cooling air in cooling air passage 31. The plurality of cooling fins 53 are arranged at equal intervals. The plurality of cooling fins 53 are arranged consecutively between side wall 22 and side wall 24.

Cooling fins 43 and cooling fins 53 each protrude from bottom wall 25, and extend linearly in a direction perpendicular to the direction of the flow of the cooling air in cooling air passage 31. Cooling fin 43 and cooling fin 53 are arranged on the same line extending in the direction perpendicular to the direction of the flow of the cooling air in cooling air passage 31.

Cooling fins 43 and cooling fins 53 are formed of a metal, and are formed of aluminum in the present embodiment. Cooling fins 43 and cooling fins 53 may be formed integrally with cooler case 21, or cooling fins 43 and cooling fins 53 formed separately may be bonded to bottom wall 25.

A cooling air branch passage 41 is formed between cooling fins 43 adjacent to each other, and a cooling air branch passage 51 is formed between cooling fins 53 adjacent to each other. Cooling air branch passage 41 and cooling air branch passage 51 are branched from cooling air passage 31 in directions opposite to each other, and extend linearly in the direction perpendicular to the direction of the flow of the cooling air in cooling air passage 31. A plurality of cooling air branch passages 41 are arranged in the direction of the flow of the cooling air in cooling air passage 31, and the plurality of cooling air branch passages 51 are arranged in the direction of the flow of the cooling air in cooling air passage 31.

In the present embodiment, in planar view shown in FIG. 2, three semiconductor elements 26 are arranged at positions overlapping with cooling air branch passages 41, and three semiconductor elements 26 are arranged at positions overlapping with cooling air branch passages 51. Three semiconductor elements 26 arranged at positions overlapping with cooling air branch passages 41 are arranged not to be placed in series in a direction in which cooling air branch passages 41 extend, that is, in a direction of flow of the cooling air in cooling air branch passages 41. Three semiconductor elements 26 arranged at positions overlapping with cooling air branch passages 51 are arranged not to be placed in series in a direction in which cooling air branch passages 51 extend, that is, in a direction of flow of the cooling air in cooling air branch passages 51.

Figure 3:
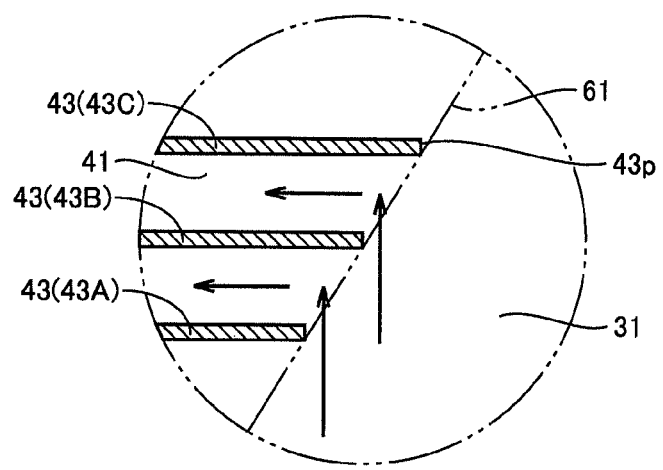
FIG. 3 is a cross sectional view showing a range indicated by a two-dot chain line III in FIG. 2 in an enlarged manner.
Figure 4:
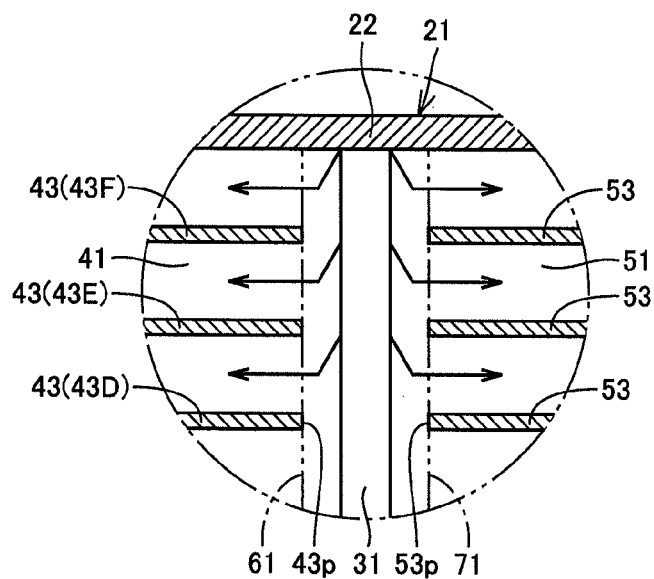
FIG. 4 is a cross sectional view showing a range indicated by a two-dot chain line IV in FIG. 2 in an enlarged manner.

FIG. 3 is a cross sectional view showing a range indicated by a two-dot chain line III in FIG. 2 in an enlarged manner. FIG. 4 is a cross sectional view showing a range indicated by a two-dot chain line IV in FIG. 2 in an enlarged manner.

Referring to FIGS. 2 to 4, cooling fin 43 and cooling fin 53 have an end portion 43p and an end portion 53p, respectively. End portion 43p is arranged at a tip of cooling fin 43 extending toward cooling air passage 31. End portion 53p is arranged at a tip of cooling fin 53 extending toward cooling air passage 31. End portion 43p and end portion 53p face each other with cooling air passage 31 interposed therebetween.

In the semiconductor element cooling structure in the present embodiment, the plurality of cooling fins 43 are provided such that end portion 43p of one cooling fin 43 does not extend more toward cooling air passage 31 than end portion 43p of cooling fin 43 adjacent thereto on the downstream side of the flow of the cooling air in cooling air passage 31. In other words, when attention is focused on two cooling fins 43 arranged adjacent to each other in the direction of the flow of the cooling air in cooling air passage 31, end portion 43p of cooling fin 43 arranged on the upstream side and end portion 43p of cooling fin 43 arranged on the downstream side are arranged to be aligned with each other in the direction of the flow of the cooling air in cooling air passage 31, or end portion 43p of cooling fin 43 arranged on the downstream side extends more toward cooling air passage 31 than end portion 43p of cooling fin 43 arranged on the upstream side.

For example, in FIG. 3, a cooling fin 43A, a cooling fin 43B, and a cooling fin 43C are arranged, in the listed order, from the upstream side to the downstream side of the flow of the cooling air in cooling air passage 31, and in FIG. 4, a cooling fin 43D, a cooling fin 43E, and a cooling fin 43F are arranged, in the listed order, from the upstream side to the downstream side of the flow of the cooling air in cooling air passage 31. In FIG. 3, end portion 43p of cooling fin 43A does not extend more toward cooling air passage 31 than end portion 43p of cooling fin 43B, and end portion 43p of cooling fin 43B does not extend more toward cooling air passage 31 than end portion 43p of cooling fin 43C. In FIG. 4, end portion 43p of cooling fin 43D does not extend more toward cooling air passage 31 than end portion 43p of cooling fin 43E, and end portion 43p of cooling fin 43E does not extend more toward cooling air passage 31 than end portion 43p of cooling fin 43F.

Similarly, the plurality of cooling fins 53 are provided such that end portion 53p of one cooling fin 53 does not extend more toward cooling air passage 31 than end portion 53p of cooling fin 53 adjacent thereto on the downstream side of the flow of the cooling air in cooling air passage 31.

A virtual line 61 is obtained by connecting end portions 43p of the plurality of cooling fins 43, and a virtual line 71 is obtained by connecting end portions 53p of the plurality of cooling fins 53. In the semiconductor element cooling structure in the present embodiment, virtual line 61 has a gradient with respect to the direction of the flow of the cooling air in cooling air passage 31 which is greater on the upstream side of the flow of the cooling air in cooling air passage 31 (i.e., in a region 92 in FIG. 2 enlarged in FIG. 3) than on the downstream side thereof (i.e., in a region 91 in FIG. 2 enlarged in FIG. 4).

More specifically, as shown in FIG. 4, on the downstream side of the flow of the cooling air in cooling air passage 31, cooling fin 43D, cooling fin 43E, and cooling fin 43F are provided such that positions of end portions 43p of the cooling fins are aligned in the direction indicated by arrow 102. That is, virtual line 61 is represented by a straight line parallel to the direction of the flow of the cooling air in cooling air passage 31, and has a gradient of zero with respect to the direction of the flow of the cooling air in cooling air passage 31.

In contrast, as shown in FIG. 3, on the upstream side of the flow of the cooling air in cooling air passage 31, end portion 43p of cooling fin 43B extends more toward cooling air passage 31 than end portion 43p of cooling fin 43A, and end portion 43p of cooling fin 43C extends more toward cooling air passage 31 than end portion 43p of cooling fin 43B. Virtual line 61 is represented by a straight line having a certain gradient with respect to the direction of the flow of the cooling air in cooling air passage 31. On the upstream side of the flow of the cooling air in cooling air passage 31, end portions 43p of the plurality of cooling fins 43 are arranged in a stair-like manner.

Similarly, virtual line 71 has a gradient with respect to the direction of the flow of the cooling air in cooling air passage 31 which is greater on the upstream side of the flow of the cooling air in cooling air passage 31 (i.e., in region 92 in FIG. 2 enlarged in FIG. 3) than on the downstream side thereof (i.e., in region 91 in FIG. 2 enlarged in FIG. 4).

In the present embodiment, the plurality of cooling fins 43 and the plurality of cooling fins 53 are provided to be symmetric with respect to cooling air passage 31.

Next, function and effect exhibited by the semiconductor element cooling structure in the present embodiment will be described.

Figure 5:
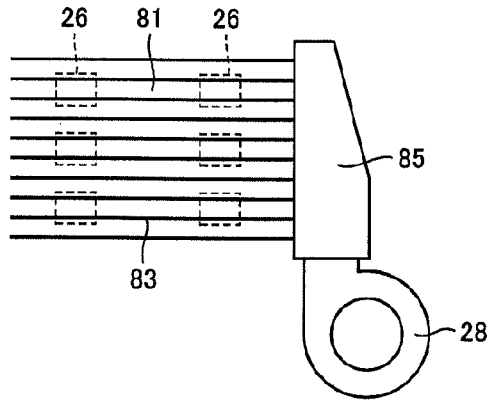
FIG. 5 is a view schematically showing a semiconductor element cooling structure for comparison.
Figure 6:
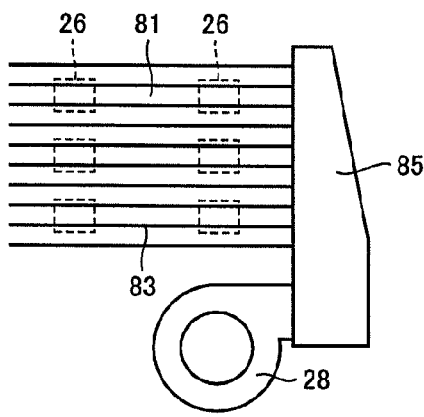
FIG. 6 is another view schematically showing a semiconductor element cooling structure for comparison.
Figure 7:
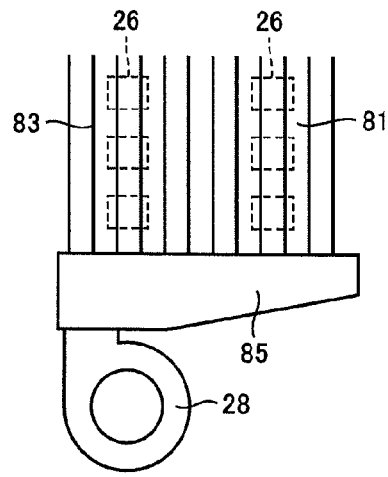
FIG. 7 is still another view schematically showing a semiconductor element cooling structure for comparison.

FIGS. 5 to 7 are views schematically showing a semiconductor element cooling structure for comparison. Referring to FIGS. 5 to 7, the semiconductor element cooling structure for comparison has a plurality of cooling fins 83 for forming cooling air passages 81, and a rectifying duct 85 for guiding cooling air supplied from centrifugal fan 28 to cooling air passages 81. The plurality of semiconductor elements 26 are arranged at positions overlapping with cooling air passages 81.

In FIG. 5, centrifugal fan 28 is connected to rectifying duct 85 such that a direction of flow of the cooling air flowing from centrifugal fan 28 into rectifying duct 85 is perpendicular to a direction of flow of the cooling air in cooling air passages 81. In FIG. 6, centrifugal fan 28 is connected to rectifying duct 85 such that the direction of the flow of the cooling air flowing from centrifugal fan 28 into rectifying duct 85 is opposite to the direction of the flow of the cooling air in cooling air passages 81. In FIG. 7, centrifugal fan 28 is connected to rectifying duct 85 such that the direction of the flow of the cooling air flowing from centrifugal fan 28 into rectifying duct 85 is identical to the direction of the flow of the cooling air in cooling air passages 81.

In the present embodiment, the inverter provided corresponding to one motor generator includes six semiconductor elements 26. In a case where the plurality of semiconductor elements 26 are cooled at once, it is required to uniformly cool the plurality of semiconductor elements 26. Thus, in the comparative examples described above, rectifying duct 85 rectifying the cooling air supplied from centrifugal fan 28 is provided to uniformly guide the cooling air supplied from centrifugal fan 28 toward the plurality of semiconductor elements 26. However, such configurations lead to an increase in the size of the semiconductor element cooling structure.

In contrast, in the semiconductor element cooling structure in the present embodiment shown in FIGS. 2 to 4, the plurality of cooling fins 43 and the plurality of cooling fins 53 are provided on both sides of cooling air passage 31 to cause the cooling air supplied from centrifugal fan 28 to cooling air passage 31 to flow in a T shape. In addition, the plurality of semiconductor elements 26 are arranged in parallel on cooling air branch passages 41 and cooling air branch passages 51 on downstream sides thereof to implement a structure causing the cooling air to uniformly flow to the plurality of semiconductor elements 26 without using a rectifying duct.

On this occasion, on the downstream side of the flow of the cooling air in cooling air passage 31, the cooling air flowing through cooling air passage 31 impinges on side wall 22 and flows into cooling air branch passages 41 and cooling air branch passages 51. Accordingly, there is a concern that the flow rate of the cooling air flowing into cooling air branch passages 41 and cooling air branch passages 51 is lower on the upstream side of the flow of the cooling air in cooling air passage 31 than on the downstream side thereof.

Thus, in the semiconductor element cooling structure in the present embodiment, on the upstream side of the flow of the cooling air in cooling air passage 31, virtual line 61 and virtual line 71 each have a gradient with respect to the direction of the flow of the cooling air in cooling air passage 31. In this case, as shown in FIG. 3, the cooling air flowing through cooling air passage 31 impinges on cooling fin 43, producing a dispersed flow in a direction parallel to cooling fin 43. The dispersed flow flows into cooling air branch passage 41 formed between adjacent cooling fins 43, and thereby the flow rate of the cooling air in cooling air branch passages 41 increases. Further, for the same reason, the flow rate of the cooling air in cooling air branch passages 51 increases.

In contrast, on the downstream side of the flow of the cooling air in cooling air passage 31, virtual line 61 and virtual line 71 each have a gradient of zero with respect to the direction of the flow of the cooling air in cooling air passage 31, and thus the effect of the dispersed flow produced by cooling fins 43 and cooling fins 53 as described above cannot be obtained. As a result, variations in the flow rate of the cooling air in cooling air branch passages 41 and cooling air branch passages 51 produced between the upstream side and the downstream side of the flow of the cooling air in cooling air passage 31 are eliminated, and thus the plurality of semiconductor elements 26 can be cooled by the cooling air with a uniform flow rate.

The semiconductor element cooling structure in Embodiment 1 of the present invention described above will now be summarized. The semiconductor element cooling structure in the present embodiment is a cooling structure having cooling air passage 31 as a cooling medium passage through which the cooling air as a cooling medium flows and cooling air branch passages 41 as first branch passages and cooling air branch passages 51 as second branch passages branched from cooling air passage 31 and arranged on both sides of cooling air passage 31 formed therein, for cooling the plurality of semiconductor elements 26 by the cooling air flowing through cooling air branch passages 41 and cooling air branch passages 51. The semiconductor element cooling structure includes side wall 22 as a wall portion provided on a downstream side of flow of the cooling air in cooling air passage 31, the plurality of cooling fins 43 as first fin portions arranged to be spaced from one another in a direction of the flow of the cooling air in cooling air passage 31 to form cooling air branch passages 41 at positions adjacent to one another, and the plurality of cooling fins 53 as second fin portions arranged to be spaced from one another in the direction of the flow of the cooling air in cooling air passage 31 to form cooling air branch passages 51 at positions adjacent to one another. Cooling fin 43 and cooling fin 53 have end portion 43p and end portion 53p, respectively, at a tip extending toward cooling air passage 31.

The plurality of cooling fins 43 are provided such that end portion 43p of cooling fin 43 does not extend more toward cooling air passage 31 than end portion 43p of cooling fin 43 adjacent thereto on the downstream side of the flow of the cooling air in cooling air passage 31. The plurality of cooling fins 53 are provided such that end portion 53p of cooling fin 53 does not extend more toward cooling air passage 31 than end portion 53p of cooling fin 53 adjacent thereto on the downstream side of the flow of the cooling air in cooling air passage 31. Virtual line 61 obtained by connecting end portions 43p of the plurality of cooling fins 43 and virtual line 71 obtained by connecting end portions 53p of the plurality of cooling fins 53 each have a gradient with respect to the direction of the flow of the cooling air in cooling air passage 31 which is greater on an upstream side of the flow of the cooling air in cooling air passage 31 than on the downstream side thereof.

With the semiconductor element cooling structure in Embodiment 1 of the present invention configured as described above, virtual line 61 obtained by connecting end portions 43p of the plurality of cooling fins 43 and virtual line 71 obtained by connecting end portions 53p of the plurality of cooling fins 53 are each formed to have a gradient with respect to the direction of the flow of the cooling air in cooling air passage 31 which is greater on the upstream side of the flow of the cooling air in cooling air passage 31 than on the downstream side thereof, which can suppress the flow rate of the cooling air in cooling air branch passages 41 and cooling air branch passages 51 from varying between the upstream side and the downstream side of the flow of the cooling air in cooling air passage 31. Thereby, the plurality of semiconductor elements 26 can be cooled more uniformly.

It is noted that the present invention is also applicable to a power control unit mounted in a fuel cell hybrid vehicle (FCHV) having a fuel cell and a secondary battery as motive power sources or an electric vehicle (EV). In the hybrid vehicle in the present embodiment, the internal combustion engine is driven at an operation point having optimum fuel efficiency, whereas in the fuel cell hybrid vehicle, the fuel cell is driven at an operation point having optimum power generation efficiency. Further, regarding the use of the secondary battery, there is basically no difference between the both hybrid vehicles.

Further, the present invention is applied not only to power control units but also to various devices which require cooling of semiconductor elements.

Embodiment 2

In the present embodiment, various modifications of the semiconductor element cooling structure in Embodiment 1 will be described. Hereinafter, regarding components identical to those of the semiconductor element cooling structure in Embodiment 1, the description thereof will not be repeated.

Figure 8:
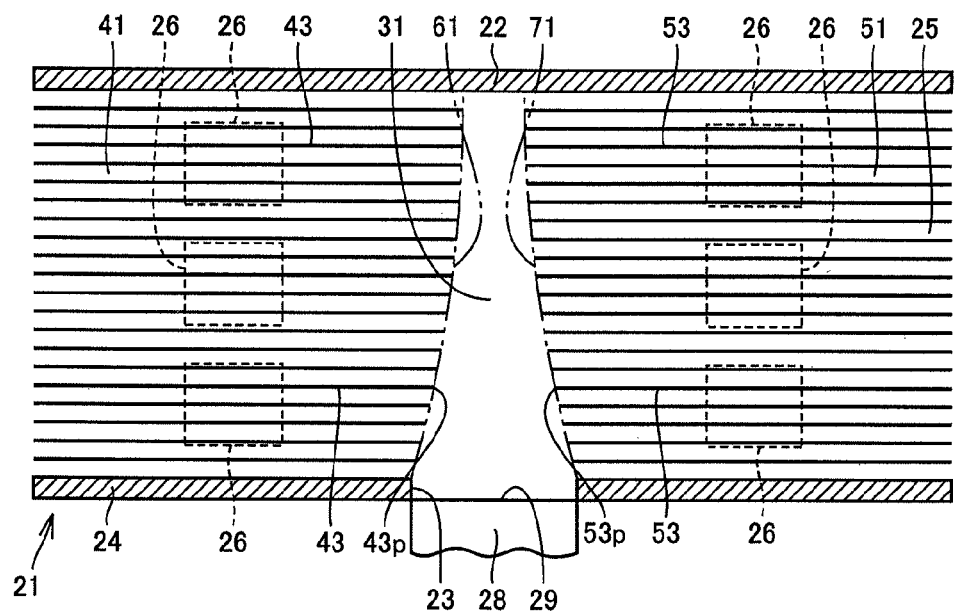
FIG. 8 is a cross sectional view showing a first modification of the semiconductor element cooling structure in FIG. 2.

FIG. 8 is a cross sectional view showing a first modification of the semiconductor element cooling structure in FIG. 2. Referring to FIG. 8, in the present modification, virtual line 61 and virtual line 71 are each curved with a gradient with respect to the direction of the flow of the cooling air in cooling air passage 31 being increased from the downstream side toward the upstream side of the flow of the cooling air in cooling air passage 31. Virtual line 61 and virtual line 71 are each curved continuously between side wall 22 and side wall 24.

Figure 9:
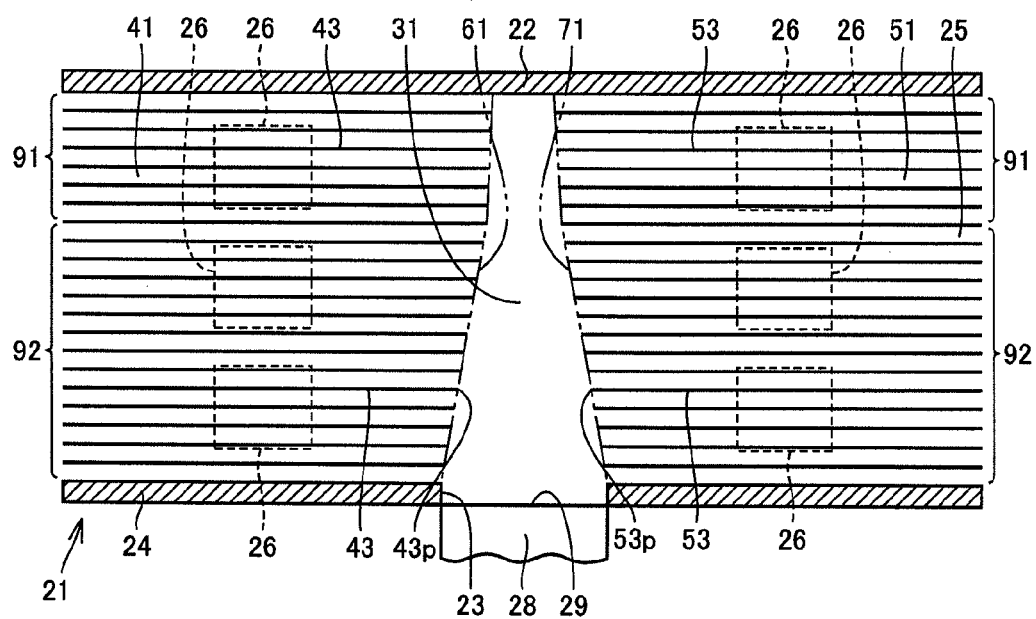
FIG. 9 is a cross sectional view showing a second modification of the semiconductor element cooling structure in FIG. 2.

FIG. 9 is a cross sectional view showing a second modification of the semiconductor element cooling structure in FIG. 2. Referring to FIG. 9, in the present modification, virtual line 61 and virtual line 71 are each represented by straight lines having certain gradients with respect to the direction of the flow of the cooling air in cooling air passage 31 on both of the downstream side (region 91) and the upstream side (region 92) of the flow of the cooling air in cooling air passage 31. The gradient of each of virtual line 61 and virtual line 71 on the upstream side (region 92) of the flow of the cooling air in cooling air passage 31 is greater than the gradient of each of virtual line 61 and virtual line 71 on the downstream side (region 91) of the flow of the cooling air in cooling air passage 31.

As virtual line 61 and virtual line 71 each have a greater gradient, the dispersed flow produced when the cooling air flowing through cooling air passage 31 impinges on cooling fins 43 and cooling fins 53 increases, and thus a phenomenon in which the flow rate of the cooling air in cooling air branch passages 41 and cooling air branch passages 51 increases becomes significant. Accordingly, in order to suppress variations in the flow rate of the cooling air in cooling air branch passages 41 and cooling air branch passages 51, lengths of the plurality of cooling fins 43 and the plurality of cooling fins 53 are adjusted to tune the gradients of virtual line 61 and virtual line 71. On this occasion, virtual line 61 and virtual line 71 may each have a shape formed by combining straight lines having different inclinations, curves, and the like as appropriate, as described in Embodiment 1 and the above modifications.

Figure 10:
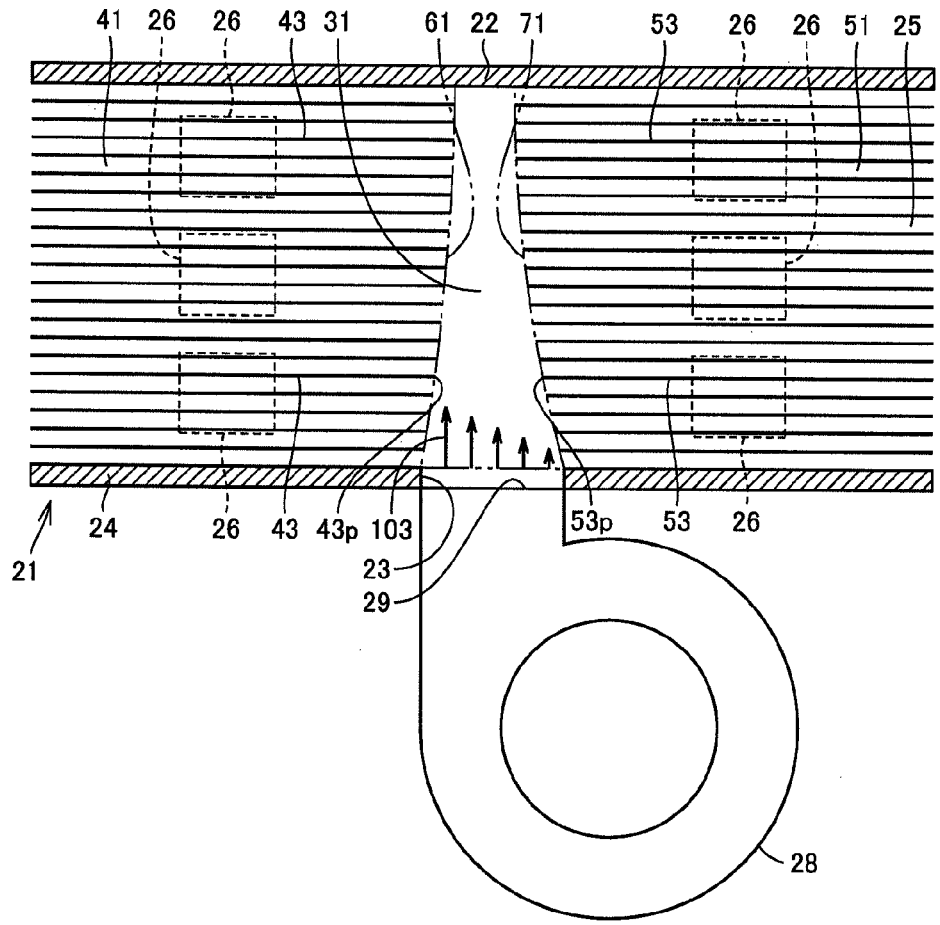
FIG. 10 is a cross sectional view showing a third modification of the semiconductor element cooling structure in FIG. 2.

FIG. 10 is a cross sectional view showing a third modification of the semiconductor element cooling structure in FIG. 2. Referring to FIG. 10, in the present modification, virtual line 61 and virtual line 71 are each curved with a gradient with respect to the direction of the flow of the cooling air in cooling air passage 31 being increased from the downstream side toward the upstream side of the flow of the cooling air in cooling air passage 31. On this occasion, when comparison is made at the same position in the flow of the cooling air in cooling air passage 31, virtual line 71 obtained by connecting end portions 53p of the plurality of cooling fins 53 has a gradient greater than that of virtual line 61 obtained by connecting end portions 43p of the plurality of cooling fins 43.

In a case where centrifugal fan 28 is used to supply the cooling air to cooling air passage 31, there occurs a phenomenon in which the cooling air blown from an outer peripheral side when seen from the center of rotation of centrifugal fan 28 has a large flow rate, and the cooling air blown from an inner peripheral side when seen from the center of rotation of centrifugal fan 28 has a small flow rate. Due to such a phenomenon, in a connection form of centrifugal fan 28 shown in FIG. 10, there occurs a flow rate distribution in which, in a cross section where centrifugal fan 28 is connected to opening 23, the flow rate of the cooling air decreases from a side close to cooling fins 43 toward a side close to cooling fins 53 (i.e., flow rate distribution indicated by arrows 103).

Thus, in the present modification, since virtual line 71 obtained by connecting end portions 53p of the plurality of cooling fins 53 has a gradient greater than that of virtual line 61 obtained by connecting end portions 43p of the plurality of cooling fins 43, the phenomenon in which the flow rate of the cooling air in cooling air branch passages 41 and cooling air branch passages 51 increases becomes more significant on the side close to cooling fins 53. As a result, irrespective of the above characteristics of centrifugal fan 28, variations between the flow rate of the cooling air in cooling air branch passages 41 and the flow rate of the cooling air in cooling air branch passages 51 can be suppressed.

Figure 11:
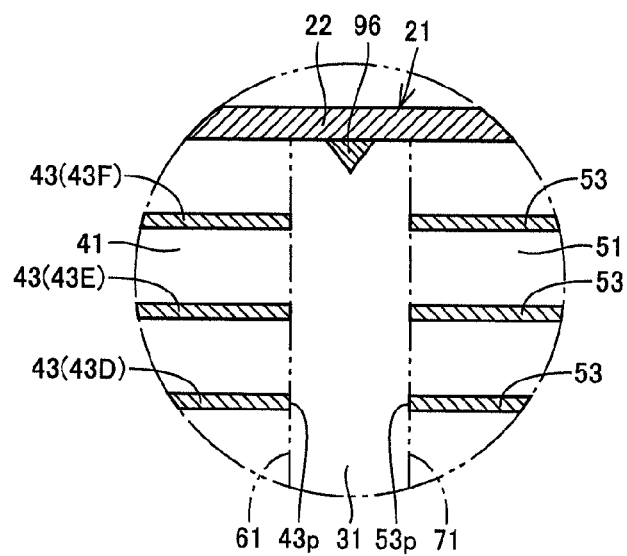
FIG. 11 is a cross sectional view showing a fourth modification of the semiconductor element cooling structure in FIG. 2.

FIG. 11 is a cross sectional view showing a fourth modification of the semiconductor element cooling structure in FIG. 2. FIG. 11 shows the same range as that shown in FIG. 4.

Referring to FIG. 11, in the present modification, a protrusion 96 is provided on side wall 22. Protrusion 96 is provided to protrude from an inner surface of side wall 22 toward cooling air passage 31. Protrusion 96 is arranged between cooling air branch passages 41 and cooling air branch passages 51. Protrusion 96 has a shape which is symmetric on a side close to cooling air branch passages 41 and on a side close to cooling air branch passages 51. In planar view shown in FIG. 11, protrusion 96 has the shape of a triangle having the apex at a tip protruding toward cooling air passage 31.

According to the present modification, since the cooling air flowing through cooling air passage 31 is smoothly diverted into cooling air branch passages 41 and cooling air branch passages 51 by protrusion 96, pressure loss in the flow of the cooling air can be reduced. Thereby, centrifugal fan 28 can have a smaller size, and the semiconductor element cooling structure can be downsized.

With the semiconductor element cooling structure in Embodiment 2 of the present invention configured as described above, the effect described in Embodiment 1 can also be obtained.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

INDUSTRIAL APPLICABILITY

The present invention is mainly applied to a cooling structure for various devices incorporating semiconductor elements.

REFERENCE SIGNS LIST

21: cooler case; 22, 24: side wall; 23: opening; 25: bottom wall; 26: semiconductor element; 28: centrifugal fan; 29: blowing outlet; 31, 81: cooling air passage; 41, 51: cooling air branch passage; 43, 43A to 43F, 53, 83: cooling fin; 43p, 53p: end portion; 85: rectifying duct; 91, 92: region; 96: protrusion; 106, 108: cable; 110: voltage sensor; 111: current sensor; 112: boost converter; 113: boosting IPM; 114, 122: inverter; 115: U-phase arm; 116: V-phase arm; 117: W-phase arm; 118: running IPM; 120: vehicle drive device; 121: power control unit; 124, 125: current sensor; 126: motive power split mechanism; 130: control device; 132: reactor; 133: smoothing capacitor; 140: battery unit; 141, 142: terminal; 143, 144: DC terminal.

The invention claimed is:

1. A semiconductor element cooling structure having a cooling medium passage through which a cooling medium flows and first branch passages and second branch passages branched from said cooling medium passage and arranged on both sides of said cooling medium passage formed therein, for cooling a plurality of semiconductor elements by the cooling medium flowing through said first branch passages and said second branch passages, comprising:

a wall portion provided on a downstream side of flow of the cooling medium in said cooling medium passage;

a plurality of first fin portions arranged to be spaced from one another in a direction of the flow of the cooling medium in said cooling medium passage to form said first branch passages at positions adjacent to one another; and a plurality of second fin portions arranged to be spaced from one another in the direction of the flow of the cooling medium in said cooling medium passage to form said second branch passages at positions adjacent to one another, wherein said first fin portions and said second fin portions each have an end portion at a tip extending toward said cooling medium passage, the plurality of said first fin portions are provided such that said end portion of said first fin portion does not extend more toward said cooling medium passage than said end portion of said first fin portion adjacent thereto on the downstream side of the flow of the cooling medium in said cooling medium passage, and the plurality of said second fin portions are provided such that said end portion of said second fin portion does not extend more toward said cooling medium passage than said end portion of said second fin portion adjacent thereto on the downstream side of the flow of the cooling medium in said cooling medium passage, and a virtual line obtained by connecting said end portions of the plurality of said first fin portions and a virtual line obtained by connecting said end portions of the plurality of said second fin portions each have a gradient with respect to the direction of the flow of the cooling medium in said cooling medium passage which is greater on an upstream side of the flow of the cooling medium in said cooling medium passage than on the downstream side thereof.

2. The semiconductor element cooling structure according to claim 1, wherein the virtual line obtained by connecting said end portions extends in a direction parallel to the direction of the flow of the cooling medium in said cooling medium passage on the downstream side of the flow of the cooling medium in said cooling medium passage, and extends in a direction oblique to the direction of the flow of the cooling medium in said cooling medium passage on the upstream side of the flow of the cooling medium in said cooling medium passage.

3. The semiconductor element cooling structure according to claim 1, wherein the virtual line obtained by connecting said end portions is curved with a gradient with respect to the direction of the flow of the cooling medium in said cooling medium passage being increased from the downstream side toward the upstream side of the flow of the cooling medium in said cooling medium passage.

4. The semiconductor element cooling structure according to claim 1, further comprising:

a case body having said wall portion and accommodating said first fin portions and said second fin portions; and a fan supplying the cooling medium toward said case body, wherein an opening opened on the upstream side of the flow of the cooling medium in said cooling medium passage is formed in said case body, and said fan is directly connected to said opening.

5. The semiconductor element cooling structure according to claim 4, wherein said fan is a centrifugal fan, and is connected to said opening such that, in a cross section where said fan is connected to said opening, a flow rate of the cooling medium decreases from a side close to said first fin portions toward a side close to said second fin portions, and the virtual line obtained by connecting said end portions of the plurality of said second fin portions has a gradient greater than that of the virtual line obtained by connecting said end portions of the plurality of said first fin portions.

6. The semiconductor element cooling structure according to claim 1, further comprising a protrusion provided on said wall portion and protruding toward said cooling medium passage between said first branch passages and said second branch passages.

* * * * *